United States Patent
Doty et al.

(10) Patent No.: US 9,954,129 B2
(45) Date of Patent: Apr. 24, 2018

(54) SYSTEMS FOR EFFICIENT PHOTON UPCONVERSION

(71) Applicants: Matthew Doty, Newark, DE (US); Joshua Zide, Newark, DE (US)

(72) Inventors: Matthew Doty, Newark, DE (US); Joshua Zide, Newark, DE (US)

(73) Assignee: UNIVERSITY OF DELAWARE, Newark, DE (US)

( * ) Notice: Subject to any disclaimer, the term of this patent is extended or adjusted under 35 U.S.C. 154(b) by 0 days.

(21) Appl. No.: 14/403,765

(22) PCT Filed: Mar. 15, 2013

(86) PCT No.: PCT/US2013/031940
§ 371 (c)(1),
(2) Date: Nov. 25, 2014

(87) PCT Pub. No.: WO2013/180817
PCT Pub. Date: Dec. 5, 2013

(65) Prior Publication Data
US 2015/0162476 A1 Jun. 11, 2015

Related U.S. Application Data

(60) Provisional application No. 61/655,064, filed on Jun. 4, 2012, provisional application No. 61/652,960, filed on May 30, 2012.

(51) Int. Cl.
*H01L 31/065* (2012.01)
*H01L 31/06* (2012.01)
(Continued)

(52) U.S. Cl.
CPC ........... *H01L 31/065* (2013.01); *B82Y 20/00* (2013.01); *H01L 31/03046* (2013.01);
(Continued)

(58) Field of Classification Search
CPC ..... H01L 31/035218; H01L 31/035236; H01L 31/035209; H01L 31/0735; H01L 31/065
See application file for complete search history.

(56) References Cited

U.S. PATENT DOCUMENTS 6,541,788 B2 * 4/2003 Petroff ................. B82Y 10/00
257/12
8,093,488 B2 1/2012 Richter
(Continued)

FOREIGN PATENT DOCUMENTS

WO 2009010623 1/2009

OTHER PUBLICATIONS

Alberi, Valence Band Anticrossing in GaBiAs, Applied Physics Letters, 2007, 91 pp. 051909-1 to 051909-3.*
(Continued)

*Primary Examiner* — Bethany L Martin
(74) *Attorney, Agent, or Firm* — RatnerPrestia

(57) ABSTRACT

Described herein are materials and systems for efficient upconversion of photons. The materials may be disposed in a system comprising two semiconductor materials with an interface therebetween, the interface comprising a valence and/or conduction band offset between the semiconducting materials of about −0.5 eV to about 0.5 eV, including 0, wherein one of the semiconductor materials is a material with discrete energy states and the other is a material with a graded composition and/or controlled band gap. The system can upconvert photons by: a) controlling energy levels of discrete energy states of a semiconducting material in a system to direct tunneling and exciton separation; b) controlling a compositional profile of another semiconducting material in the system to funnel charges away from an upconversion region and into a recombination zone; and c)
(Continued)

utilizing the discrete energy states of the semiconducting material in the system to inhibit phonon relaxation.

13 Claims, 4 Drawing Sheets

(51) Int. Cl.
*H01L 31/0304* (2006.01)
*H01L 31/0352* (2006.01)
*B82Y 20/00* (2011.01)
*H01L 31/072* (2012.01)
*H01L 31/0735* (2012.01)
*B82Y 30/00* (2011.01)

(52) U.S. Cl.
CPC ........... *H01L 31/035209* (2013.01); *H01L 31/035218* (2013.01); *H01L 31/035227* (2013.01); *H01L 31/035236* (2013.01); *H01L 31/06* (2013.01); *H01L 31/072* (2013.01); *H01L 31/0735* (2013.01); *B82Y 30/00* (2013.01); *Y02E 10/544* (2013.01); *Y02P 70/521* (2015.11)

(56) References Cited

U.S. PATENT DOCUMENTS

| | | | |
|---|---|---|---|
| 2007/0151592 A1* | 7/2007 | Forrest | B82Y 10/00 136/243 |
| 2008/0092946 A1 | 4/2008 | Munteanu | |
| 2010/0206351 A1 | 8/2010 | ConesaCegarra | |
| 2010/0288344 A1 | 11/2010 | Spitzer | |
| 2012/0060918 A1 | 3/2012 | Spitzer | |
| 2012/0097228 A1* | 4/2012 | Yoshikawa | B82Y 20/00 136/255 |
| 2012/0160312 A1* | 6/2012 | Arakawa | B82Y 20/00 136/255 |
| 2012/0168816 A1* | 7/2012 | Sweeney | B82Y 20/00 257/103 |

OTHER PUBLICATIONS

International Search Report for International Application No. PCT/US2013/031940 dated Jun. 6, 2013.
International Preliminary Report on Patentability for International Application No. PCT/US2013/031940 dated Dec. 2, 2014.
Ashcroft, N.W., et al., "Solid State Physics," 1976, pp. 1-24, Brooks/Cole, Cengage Learning.
Kittel, C., et al., "Introduction to solid state physics—8th edition," 2005, pp. 1-27, John Wiley & Sons.
Grundmann, M., "Physics of semiconductors," 2016, pp. 1-68, Springer International Publishing AG Switzerland (Part 1).
Grundmann, M., "Physics of semiconductors," 2016, pp. 1-67, Springer International Publishing AG Switzerland (Part 2).
Davies, J.H., "The physics of low-dimensional semiconductors: an introduction," 1998, pp. 1-35, Cambridge University Press (Part 1).
Davies, J.H., "The physics of low-dimensional semiconductors: an introduction," 1998, pp. 1-34, Cambridge University Press (Part 2).

\* cited by examiner

US 9,954,129 B2

SYSTEMS FOR EFFICIENT PHOTON UPCONVERSION

CROSS-REFERENCE TO RELATED APPLICATIONS

This application is a U.S. National Phase Application of International Application No. PCT/US2013/031940, filed Mar. 15, 2013, which claims priority to U.S. Provisional Patent Application No. 61/655,064, filed Jun. 4, 2012 and U.S. Provisional Patent Application No. 61/652,690, filed May 30, 2012. The entire disclosure of each of the aforementioned applications is incorporated herein by reference for all purposes.

FIELD OF THE INVENTION

The present invention pertains to systems, such as nanostructures, that are useful in photovoltaics (PV) and other applications involving the absorption of light. More specifically, the present invention pertains to systems, such as those including quantum dots and/or compositions with a graded profile, that are useful for upconversion (UC) of photons by using discrete quantum states and graded potentials to suppress radiative and non-radiative loss mechanisms and efficiently convert two photons of light into a single higher energy photon.

BACKGROUND OF THE INVENTION

Although photovoltaic systems have become increasingly cost-effective, they have not begun to significantly displace fossil fuels in the United States or elsewhere. Market forces will drive the adoption of PV systems if the installed cost per watt falls below the price of fossil fuels. Approximately half of the installed cost of PV systems comes from the PV modules and the remainder from installation, electronics and land costs. Although less-expensive and less-efficient PV device technologies can reduce the module cost, they often do not significantly alter the "balance-of-systems" cost and can, in fact, increase the land costs. Minimally expensive approaches to high-efficiency PV are therefore of significant value.

Photon upconversion (UC) is a process in which the sequential absorption of two or more lower-energy photons leads to the emission of a single photon with higher energy than any of the absorbed photons. Photon UC can enable low-cost high-efficiency solar energy harvesting and can be useful in both single- and multi-junction photovoltaic devices. Photon upconversion also has applications in military operations, energy efficient lighting, information gathering and security operations.

Photon upconversion has been previously demonstrated, but photon upconversion cannot alter the economics of PV devices and other technologies unless it is highly efficient. There are two important metrics of efficiency: 1) probability of upconversion and 2) emitted photon energy. The probability of upconversion is determined by the average number of low energy photons absorbed for every high energy photon emitted. Upconversion probability efficiency is maximized when all absorbed low energy photons are converted into emitted high energy photons, e.g., no more than two low energy photons are absorbed for every high energy photon emitted. Photon energy efficiency is limited by energy conservation; the emitted photon must have energy less than or equal to the sum of the energy of all incident photons that participate in the upconversion process. Photon energy efficiency is maximized when the emitted photon has energy equal to the sum of the incident photons. Device applications, including PV devices, benefit from maximizing both emitted photon energy and upconversion probability.

Existing approaches to upconversion have relatively low efficiency. Nonlinear upconversion (e.g. frequency doubling) proceeds via virtual intermediate states. Although photon energy conversion efficiency is maximized by frequency doubling, the probability of upconversion is extremely low and is not relevant for solar photon fluxes. Auger upconversion processes are inefficient because they require the simultaneous presence of two electron-hole pairs (excitons), require radiative emission (loss) of one absorbed low-energy photon, and typically upconvert by only a few hundred meV. Thus both the upconversion probability and photon energy efficiency of Auger processes is very low. Approaches based on lanthanide-doped $NaYF_4$ and other similar existing materials upconvert by a process with similarly low photon energy efficiency.

U.S. Pat. No. 8,093,488 discloses a hybrid photovoltaic cell using amorphous silicon germanium absorbers with wide band-gap dopant layers and a photon up-converter. This document discloses use of quantum dots of a single material for upconversion. Efficient photon upconversion has proven difficult with single quantum dot materials because there is no path to achieving high upconversion probability.

Published U.S. Patent Application No. 2010/0288344 discloses methods and apparatus for wavelength conversion in solar cells and solar cell covers by upconverting two low-energy photons into one high-energy photon and by down-converting one high energy photon into two low-energy photons. The document discloses absorber/emission layers doped by rare earth elements or comprised of multi-quantum well structures. The structures disclosed in Application No. 2010/0288344 have a limited maximum efficiency because the energy loss pathways are very challenging to suppress.

Maximizing the probability of upconversion requires minimizing radiative and nonradiative loss pathways for electrons and holes generated by absorbed low-energy photons. Some sacrifice of photon energy is required to minimize these loss pathways and maximize the probability of upconversion. High net upconversion efficiency requires a device that maximizes the probability of upconversion while minimizing the photon energy that must be sacrificed. Thus, there is a need for an approach that maximizes net upconversion efficiency.

SUMMARY OF THE INVENTION

Described herein are materials, and systems that comprise such materials, that efficiently upconvert two lower-energy photons into a single higher energy photon.

One aspect of the invention provides a system comprising at least two semiconductor materials with an interface therebetween, the interface comprising a controlled valence and/or conduction band offset between the at least two semiconducting materials of about −0.5 eV to about 0.5 eV, or about −0.2 eV to about 0.2 eV, or about −0.1 eV to about 0.1 eV, and including about 0, wherein one of the semiconductor materials is a material with discrete energy states and wherein one of the semiconductor materials is a material with a graded composition, the system being adapted to suppress radiative and nonradiative relaxation pathways. Another aspect of the invention provides a system comprising at least two semiconductor materials with an interface therebetween, the interface comprising a controlled valence and/or conduction band offset between the at least two semiconducting materials of about −0.5 eV to about 0.5 eV, or about −0.2 eV to about 0.2 eV, or about −0.1 eV to about 0.1 eV, and including about 0, wherein one of the semiconductor materials is a material with discrete energy states and wherein one of the semiconductor materials is a material with a graded composition, the system being adapted to maximize the probability of radiative emission of a high energy photon.

One aspect of the invention provides the discrete energy levels from a quantum dot, a quantum well or a nanostructure or provides the discrete energy levels from indium arsenide, gallium arsenide or indium gallium arsenide. Another aspect of the invention provides a graded composition that comprises at least one of indium, aluminum, gallium, bismuth and arsenic, such as a graded composition described by $In_{1-x-y}Al_xGa_yBi_{1-z}As_z$, wherein 1-x-y falls within the range of 0 to 1, x falls within the range of 0 to 1 and 1-z falls within the range of 0 to 1; or wherein 1-x-y falls within the range of 0 to 1, x falls within the range of 0 to 1 and 1-z falls within the range of 0.001 to 1; or 1-x-y falls within the range of about 0.1 to about 0.75, x falls within the range of about 0.5 to about 1 and 1-z falls within the range of about 0.01 to about 0.3; or 1-x-y falls within the range of about 0.2 to about 0.5, x falls within the range of about 0.5 to about 0.8 and 1-z falls within the range of about 0.05 to about 0.2.

Another aspect of the invention provides a method for producing a single high energy photon, the method comprising: a) controlling energy levels of discrete energy states of a semiconducting material in a system to direct tunneling and exciton separation; b) controlling a compositional profile of another semiconducting material in the system to funnel charges away from an upconversion region and into a recombination zone; and c) utilizing the discrete energy states of the semiconducting material in the system to inhibit phonon relaxation. Another aspect of the invention provides upconverting two low-energy photons into a single photon of higher energy. Another aspect of the invention provides controlling the energy profile of a semiconducting material by grading the compositional profile.

DESCRIPTION OF THE FIGURES

The present invention is illustrated by way of example, and not by way of limitation, in the figures of the accompanying drawings and in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
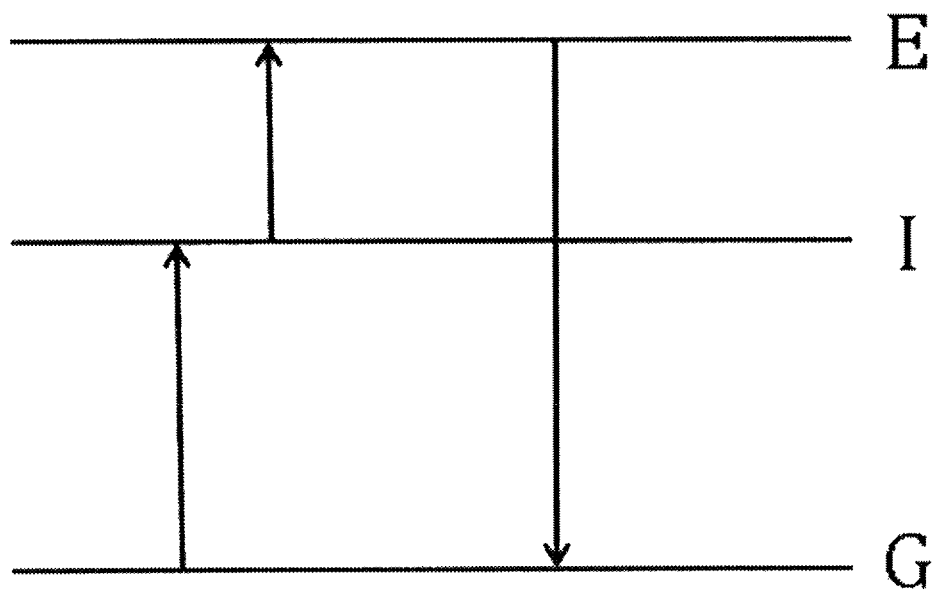
FIG. 1 shows an energy schematic of an ideal upconversion process.

In an ideal upconversion process, the sequential absorption of two low-energy photons promotes an electron from the ground state (G) to an intermediate state (I) and then to an excited state (E), as shown in FIG. 1. The electron then radiatively relaxes from the E to G state, emitting a high-energy photon. The presence of the I state introduces both nonradiative (thermal) and radiative (photon emission) relaxation pathways, e.g., radiative and nonradiative loss mechanisms. Suppressing these loss mechanisms improves the efficiency of an upconversion (UC) material. The UC materials and systems described herein are designed to maximize the efficiency of the process described by FIG. 1, whereby the energy input may be from solar, ultraviolet (UV), visible and/or infrared (IR) energy.

Figure 2:
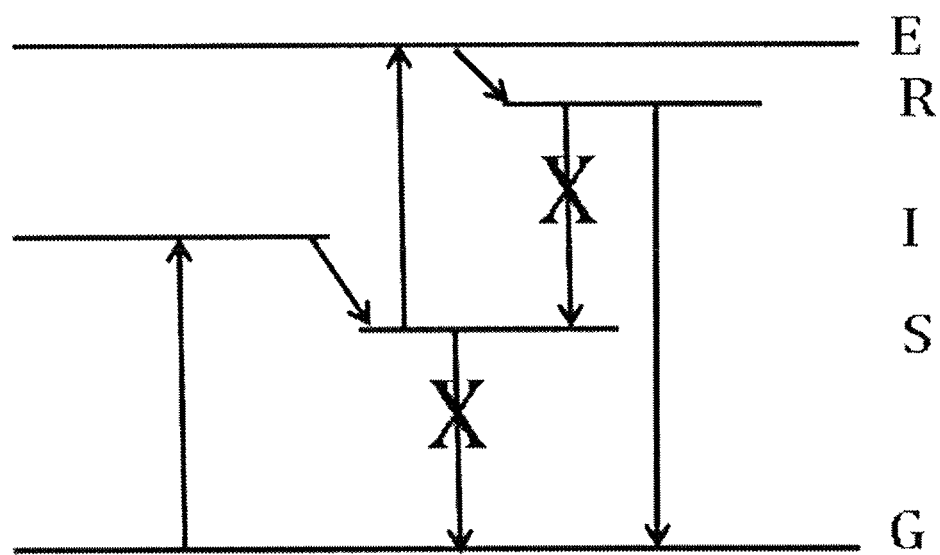
FIG. 2 shows an energy schematic of a photon ratchet process in which some photon energy is intentionally sacrificed to maximize upconversion probability.

Materials with discrete energy states [e.g., quantum dots (QDs), quantum wells (QWs), certain nanostructures, etc.] and/or graded compositional profiles provide a unique opportunity to control exciton absorption, exciton dissociation, radiative recombination and nonradiative relaxation in order to suppress energy relaxation pathways, e.g. loss mechanisms. Such discrete energy states inhibit thermal relaxation and can be tuned with composition and size to create materials tailored for absorbing photons with specific energy. Discrete energy states that can absorb photons can also emit photons and therefore cannot, by themselves, adequately suppress radiative loss out of the intermediate state. The radiative loss from such discrete energy states can be suppressed by the "photon ratchet" approach shown in FIG. 2, in which thermal relaxation transfers electrons or excitons to a shelving state (S) that is not radiatively coupled to the ground state. A similar transfer to a radiative (R) state suppresses radiative recombination from the E state to the I or S state, but allows emission of a high-energy photon upon radiative recombination from the R to the G state. The thermal (nonradiative) relaxation between states is suppressed by rapidly moving charges away from the low energy states to which they could thermally relax and by using phonon bottlenecks to suppress relaxation rates. This photon ratchet approach controllably sacrifices a small amount of photon energy to thermal loss in order to improve upconversion efficiency.

The photon ratchet may be implemented by: a) controlling the relative energies of confined energy levels, discrete energy states and bulk band edges to direct tunneling and exciton separation; b) controlling the compositional profile (e.g., grading and/or band offsets) to funnel charges away from an upconversion region and into a recombination zone; and c) utilizing the discrete energy states to inhibit phonon relaxation. The photon ratchet approach may be realized by implementing any system that is capable of meeting steps a)-c) above. For example, and without limitation, the system may comprise at least two semiconductor materials with an interface therebetween, the interface comprising a valence and/or conduction band offset between the semiconducting materials of about −0.5 eV to about 0.5 eV, or about −0.2 eV to about 0.2 eV, or about −0.1 eV to about 0.1 eV, and including about 0, wherein one of the semiconductor materials is a material with discrete energy states and wherein one of the semiconductor materials is a material with a graded composition, the system being adapted to efficiently upconvert photons, e.g., upconvert two photons into a single higher energy photon.

Figure 3:
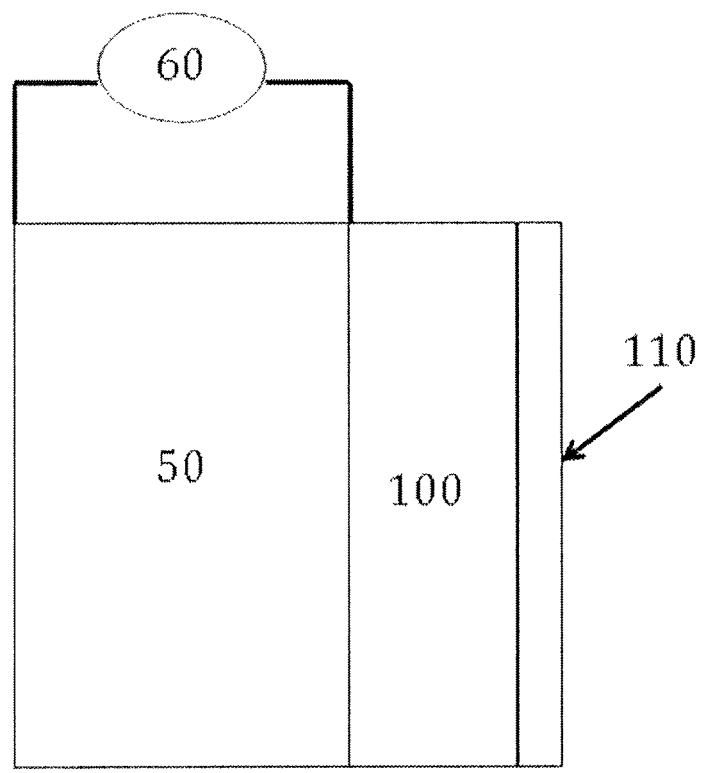
FIG. 3 shows a schematic of a photon upconversion system disposed on a PV device.

An approach to implement the system described herein in a real-world device is shown in FIG. 3, which shows a photon upconversion layer 100 disposed between a photovoltaic device 50 having a circuit 60 and a reflective layer 110. Photon upconversion layer 100 can be added to the back side (e.g., transparent back contact) of a single junction PV diode acting as photovoltaic device 50. Because the interface between photovoltaic device 50 and photon upconversion layer 100 is primarily optical, addition of a layer of photon upconverting materials 100 requires minimal changes to existing device technology. Thus, the layout of FIG. 3 offers a minor modification that can dramatically reduce land use and other "balance-of-systems" costs by enhancing efficiency without changing module sizes, weights, or complexity, while also enabling efficient use of wide band gap materials for PV devices, which broadens the number of economically and environmentally sustainable materials available for use.

The system, such as photon upconversion layer 100, can be made from materials that are compatible with physical, vapor and/or chemical deposition methods. The materials could also be made compatible with reel-to-reel processing, spray-coating or other low-cost fabrication methods. Specific methods of fabricating upconversion materials may include, without limitation, molecular beam epitaxy (MBE), metal-organic chemical vapor deposition (MOCVD) and colloidal synthesis (e.g., colloidal nanoparticle synthesis). The methods of making the systems described herein are not particularly limited, so long as they can produce a system that is capable of meeting steps a)-c) above.

The system may be fabricated from any number of semiconducting materials. For example, the system may comprise at least two semiconductor materials with an interface therebetween, the interface comprising a valence and/or conduction band offset between the semiconducting materials of about −0.5 eV to about 0.5 eV, or about −0.2 eV to about 0.2 eV, or about −0.1 eV to about 0.1 eV, and including about 0, wherein one of the semiconductor materials is a material with discrete energy states and wherein one of the semiconductor materials is a material with a graded and/or controlled band offset composition, the system being adapted to efficiently upconvert photons, e.g., upconvert two photons into a single higher energy photon. More preferably, the interface comprises a valence and/or conduction band offset between the semiconducting materials of about −0.3 eV to about 0.3 eV, and most preferably, the interface comprises a valence and/or conduction band offset between the semiconducting materials of about −0.2 eV to about 0.2 eV, or about −0.1 eV to about 0.1 eV. Preferably, the valence and/or conduction band offset is controlled in such a manner so as to produce a valence and/or conduction band offset between the semiconducting materials of about zero or as close as possible to about zero.

Figure 4:
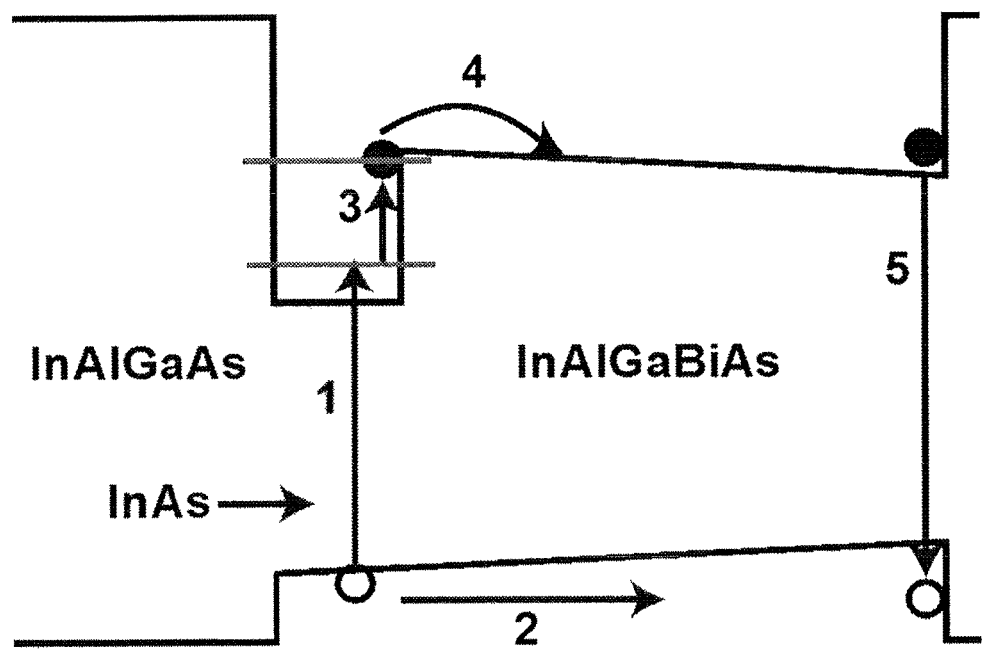
FIG. 4 shows a representative system that can be used for efficient photon upconversion.

A representative system may comprise InAs QDs embedded in an InAlGaBiAs host, as shown in FIG. 4. In FIG. 4, absorption of a mid-energy photon promotes an electron to a confined state (e.g., arrow 1). Rapid escape of the hole (e.g., arrow 2) due to controlled (e.g., about 0) valence band offset achieved with the tailored and graded host composition prevents radiative recombination. Absorption of a low-energy photon (e.g., arrow 3) promotes the electron to a high-energy state from which it escapes (e.g., arrow 4) to reach the recombination zone and emit a high-energy photon (e.g., arrow 5). In this representative system the InAlGaBiAs composition fractions are used to independently control the bandgap and individual band alignments in order to engineer exciton dissociation and charge transport to increase upconversion efficiency. Therefore, such a system is capable of meeting steps a)-c) above.

The semiconductor material with discrete energy states is not particularly limited and may be a quantum dot, a quantum well, a nanostructure or any other material with discrete energy states. The material with discrete energy states may comprise any semiconducting material or materials known to form semiconductors, such as, without limitation, Si, In, Al, Ga, Bi, Cd, Se, Te, S, Pb, Zn, As, N and combinations thereof. Preferably, the material comprises indium arsenide or indium gallium arsenide. The semiconductor material with a graded composition is not particularly limited and may comprise any semiconducting material or materials known to form semiconductors, such as, without limitation, Si, In, Al, Ga, Bi, Cd, Se, Te, S, Pb, Zn, As, N and combinations thereof. Preferably, the material comprises a compound containing indium, aluminum, gallium, bismuth and/or arsenic.

The dimensions of the semiconducting materials are not particularly limited, so long as they produce a system that is capable of meeting steps a)-c) above. With respect to the representative system of FIG. 4, the InAs QDs may have any suitable dimensions, such as a thickness of at least about 1 nm. More preferably, the InAs QDs have a thickness of at least about 4 nm. The InAs QDs may have a width of at least about 5 nm. More preferably, the InAs QDs have a width of at least about 10 nm, or at least about 20 nm. The thickness and width of the InAs QDs may be uniform or non-uniform therethrough. For example, the InAs QDs may have a lens-like cross-section, with a width that is widest near the base and narrower as one moves away from the base. Other realizations of this invention may contain regions of semiconducting materials that are spherical or have other shapes. The InAlGaBiAs host may have a thickness that is not particularly limited, and may be anywhere from at least about 10 nm, or at least about 25 nm, or at least about 50 nm, or at least about 100 nm, or at least about 500 nm, or at least about 1 µm. The InAlGaBiAs host may have a width that is not particularly limited, and may be anywhere from a few nanometers to several inches in width. The thickness and width of the InAlGaBiAs host may be uniform or non-uniform therethrough.

The InAlGaBiAs host is preferably described by $In_{1-x-y}Al_xGa_yBi_{1-z}As_z$, wherein 1-x-y falls within the range of 0 to 1, x falls within the range of 0 to 1 and 1-z falls within the range of 0 to 1; or wherein 1-x-y falls within the range of 0 to 1, x falls within the range of 0 to 1 and 1-z falls within the range of 0.001 to 1; or 1-x-y falls within the range of about 0.1 to about 0.75, x falls within the range of about 0.5 to about 1 and 1-z falls within the range of about 0.01 to about 0.3; or 1-x-y falls within the range of about 0.2 to about 0.5, x falls within the range of about 0.5 to about 0.8 and 1-z falls within the range of about 0.05 to about 0.2.

The $In_{1-x-y}Al_xGa_yBi_{1-z}As_z$ host may have a graded composition throughout its dimensions. A graded composition of the host also means a graded electric potential. A general trend of the $In_{1-x-y}Al_xGa_yBi_{1-z}As_z$ host is that electric potential decreases with increasing percentages of indium. The grading of the $In_{1-x-y}Al_xGa_yBi_{1-z}As_z$ host is not particularly limited, as long as it produces a host that comprises graded electric potentials that direct electron and hole motion to suppress energy loss. Preferably, the host has graded electric potentials that fall within the range of about 1 eV to about 2.5 eV.

What is claimed is:

1. A system adapted to upconvert two or more photons into one higher energy photon, the system comprising:

first and second semiconductor materials with an interface therebetween, the interface comprising a first offset between one of respective valence bands of the first and second semiconducting materials or respective conduction bands of the first and second semiconducting materials, the first offset being from about −0.5 eV to about 0.5 eV, and a second offset between the other one of respective valence bands of the first and second semiconducting materials or respective conduction bands of the first and second semiconducting materials, wherein the first semiconductor material is a material with discrete energy states, wherein the second semiconductor material comprises $In_{1-x-y}Al_xGa_yBi_{1-z}As_z$, wherein 1-x-y falls within the range of 0 to 1, x falls within the range of 0 to 1, and 1-z falls within the range of 0.001 to 1; or wherein 1-x-y falls within the range of about 0.1 to about 0.75, x falls within the range of about 0.5 to about 1, and 1-z falls within the range of about 0.01 to about 0.3; or wherein 1-x-y falls within the range of about 0.2 to about 0.5, x falls within the range of about 0.5 to about 0.8, and 1-z falls within the range of about 0.05 to about 0.2, and wherein the second semiconductor material has a graded composition and/or controlled band gap such that the valence and conduction bands of the second semiconductor material have a band gap that decreases in a direction away from the interface, and wherein the system is adapted to upconvert the two or more photons into the one higher energy photon.

2. The system of claim 1, wherein the first semiconductor material is a quantum dot, a quantum well or a nanostructure; or wherein the first semiconductor material comprises indium arsenide, gallium arsenide or indium gallium arsenide.

3. The system of claim 1, wherein the second semiconductor material comprises indium, gallium, aluminum and arsenic.

4. The system of claim 1, wherein the first offset is about −0.2 eV to about 0.2 eV.

5. The system of claim 1, wherein the first offset is about −0.1 eV to about 0.1 eV.

6. The system of claim 1, wherein the first offset is about zero.

7. The system of claim 1, wherein the first and second semiconductor materials are fabricated by a chemical, physical and/or vapor deposition process.

8. The system of claim 1, wherein the two or more photons are each of lower energy than the higher energy photon.

9. The system of claim 1, wherein a slope of the valence band of the second semiconductor material is opposite a slope of the conduction band of the second semiconducting material.

10. A system adapted to absorb two or more photons and emit one photon with energy higher than energy of any of the two or more absorbed photons comprising:

first and second semiconductor materials with an interface therebetween, each semiconductor material having a valence band and a conduction band, wherein the valence band of the first semiconductor material has an offset relative to the valence band of the second semiconductor material at the interface, the offset between the respective valence bands having a value from about −0.5 eV to about 0.5 eV, the conduction band of the first semiconductor material has an offset relative to the conduction band of the second semiconductor material at the interface, the first semiconductor material is a material with discrete energy states, the second semiconductor material has a graded composition that results in a band gap that decreases with increasing distance away from the interface, such that electrons and holes generated by absorption of the two or more photons, wherein the system is adapted to absorb the two or more photons and emit the one photon with energy higher than energy of any of the two or more absorbed photons move in a direction away from the interface toward a recombination zone, and the band gap in the recombination zone is configured to allow recombination of the electrons and holes to generate the higher energy photon, wherein the system is adapted to absorb the two or more photons and emit the one photon with energy higher than energy of any of the two or more absorbed photons.

11. The system of claim 10, wherein a slope of the valence band of the second semiconductor material is opposite a slope of the conduction band of the second semiconducting material.

12. A system adapted to absorb two or more photons and emit one photon with energy higher than energy of any of the two or more absorbed photons comprising:

first and second semiconductor materials with an interface therebetween, each semiconductor material having a valence band and a conduction band, wherein the conduction band of the first semiconductor material has an offset relative to the conduction band of the second semiconductor material at the interface, the offset between the respective conduction bands having a value from about −0.5 eV to about 0.5 eV, the valence band of the first semiconductor material has an offset relative to the valence band of the second semiconductor material at the interface, the first semiconductor material is a material with discrete energy states, the second semiconductor material has a graded composition that results in a band gap that decreases with increasing distance away from the interface, such that electrons and holes generated by absorption of the two or more photons move in a direction away from the interface toward a recombination zone, and the band gap in the recombination zone is configured to allow recombination of the electrons and holes to generate the higher energy photon, wherein the system is adapted to absorb the two or more photons and emit the one photon with energy higher than energy of any of the two or more absorbed photons.

13. The system of claim 12, wherein a slope of the valence band of the second semiconductor material is opposite a slope of the conduction band of the second semiconducting material.

* * * * *

UNITED STATES PATENT AND TRADEMARK OFFICE
CERTIFICATE OF CORRECTION

| | | |
|---|---|---|
| PATENT NO. | : 9,954,129 B2 | Page 1 of 1 |
| APPLICATION NO. | : 14/403765 | |
| DATED | : April 24, 2018 | |
| INVENTOR(S) | : Matthew Doty and Joshua Zide | |

It is certified that error appears in the above-identified patent and that said Letters Patent is hereby corrected as shown below:

In the Claims

Claim 10, Column 8, Line 15 to Line 18, after photons delete ", wherein the system is adapted to absorb the two or more photons and emit the one photon with energy higher than energy of any of the two or more absorbed photons"

Signed and Sealed this
Twenty-ninth Day of May, 2018

Andrei Iancu
*Director of the United States Patent and Trademark Office*